(12) United States Patent
Gerding

(10) Patent No.: US 8,253,439 B2
(45) Date of Patent: Aug. 28, 2012

(54) CIRCUIT ARRANGEMENT FOR PRODUCING SHORT ELECTRICAL PULSES

(75) Inventor: Michael Gerding, Bochum (DE)

(73) Assignee: KROHNE Messtechnik GmbH, Duisburg (DE)

( * ) Notice: Subject to any disclaimer, the term of this patent is extended or adjusted under 35 U.S.C. 154(b) by 374 days.

(21) Appl. No.: 12/632,237

(22) Filed: Dec. 7, 2009

(65) Prior Publication Data

US 2010/0148824 A1   Jun. 17, 2010

(30) Foreign Application Priority Data

Dec. 8, 2008 (DE) .................. 10 2008 060 663

(51) Int. Cl.
*H03K 17/16* (2006.01)
*H03K 19/003* (2006.01)
(52) U.S. Cl. ............... 326/29; 326/93; 326/99; 326/104
(58) Field of Classification Search .................. None
See application file for complete search history.

(56) References Cited

U.S. PATENT DOCUMENTS

| 4,442,362 A | 4/1984 | Rao |
| 4,996,474 A * | 2/1991 | Tambe et al. ............... 324/76.48 |
| 6,204,707 B1 * | 3/2001 | Hamada et al. ............... 327/202 |
| 6,556,043 B2 * | 4/2003 | Garcia ............................. 326/40 |
| 7,176,715 B1 * | 2/2007 | LeBlanc ......................... 326/38 |
| 7,315,220 B1 | 1/2008 | Robinson et al. |
| 7,332,978 B2 | 2/2008 | Tiwari et al. |
| 2005/0180196 A1 * | 8/2005 | Da Silva et al. ............... 365/154 |

FOREIGN PATENT DOCUMENTS

| DE | 103 59 441 A1 | 4/2005 |
| JP | 58-120319 A | 7/1983 |
| WO | 2007/008454 A2 | 1/2007 |

* cited by examiner

*Primary Examiner* — Anh Tran
(74) *Attorney, Agent, or Firm* — Roberts Mlotkowski Safran & Cole, P.C.; David S. Safran

(57) ABSTRACT

A circuit arrangement for producing short electrical pulses, including a logic gate (1) with a very short gate transit time and having a clock signal being supplied to a trigger input (2) of the logic gate (1) as a trigger signal. An output signal based on the trigger signal is generated as a short electrical pulse at an output (3) or at one output (3 or 4) or at both outputs (3 and 4) of the logic gate (1).

7 Claims, 2 Drawing Sheets

CIRCUIT ARRANGEMENT FOR PRODUCING SHORT ELECTRICAL PULSES

BACKGROUND OF THE INVENTION

1. Field of Invention

The invention relates to a circuit arrangement for producing short electrical pulses.

2. Description of Related Art

Short electrical pulses are employed in many areas of communications engineering and measurement engineering, and for example also in liquid level measurement engineering.

A plurality of circuit arrangements are known for producing short electrical pulses, for example, as described in German Patent Application 103 59 441, PCT Patent Application WO 2007/008,454, and U.S. Pat. Nos. 4,442,362 and 6,087,871.

Accordingly, although there may exist a plurality of circuit arrangements for producing short electrical pulses, there is still a need for improved circuit arrangements of this type.

SUMMARY OF THE INVENTION

In view of the foregoing, a primary object of the present invention is to provide a novel circuit arrangement for producing short electrical pulses.

A circuit arrangement in accordance with the present invention for producing short electrical pulses, as described herein, can include a logic gate with a very short gate transit time having a clock signal being supplied to a trigger input thereof as a trigger signal, and with an output signal, based on the trigger signal, being generated at an output of the logic gate as a short electrical pulse. Such circuit arrangement has major advantages over known circuit arrangements.

For example, such circuit arrangement is of very low complexity, and of very low power consumption.

In addition, in the circuit arrangement, the clock signal can be at a logic level corresponding to a selected logic family, and advantageously the short electrical pulses generated are available at a low-resistance output of the logic gate. Finally, negative bias voltages need not be employed, and if the logic gate is an Electrostatic discharge (ESD)-protected logic gate, there is inherently provided ESD-resistance with the circuit arrangement.

According to a further embodiment, the circuit arrangement is configured with the logic gate as a high-speed D-flip-flop (D-FF) with a clear input, and a preset input. With this embodiment, advantageously, short electrical pulses are provided, also referred to as baseband pulses, with positive and negative polarity. If logic gates without a clear input or without a preset input are employed, the selection of the polarity of the generated electrical pulses is limited.

According to a further embodiment, the circuit arrangement is configured with the logic gate as an individual gate, for example, an AND gate, an OR gate, a NAND gate, an EXOR gate or an INVERTER gate.

As noted above, the circuit arrangement can be of low circuit complexity. This is not contradicted, when according to another embodiment, a pulse shaper network, used to shorten the duration of the generated short electrical pulses, is connected downstream of the output of the logic gate that generates the output signal. A fundamental advantage is based on the use of very short logic gate transit times. However, if short electrical pulses need be employed and which cannot be generated by using such short logic gate transit times, the above described downstream connection of a corresponding pulse shaper network advantageously provides such a feature.

A further aspect of the present invention may seem paradoxical or absurd in view of the object of generating short electrical pulses, wherein in a feedback path of the logic gate there is provided an electrical component with a lowpass behavior, by which the pulse duration of the generated electrical pulses is lengthened. However, the circuit arrangement in accordance with the invention can include a series of logic gates with very short gate transit times, such that for a given application electrical pulses of various pulse duration can be generated.

In a further aspect of the present invention, there is provided a further logic gate, for example, an INVERTER gate, in the feedback path of the logic gate of the circuit arrangement. When using such a further logic gate in the feedback path of the primary logic gate, one must ensure that the signal fed back by additional logic gate and the signal on the input side on the logic gate interplay so as to be able to switch the output signal of the logic gate.

In particular, there are various possibilities for embodying and developing the circuit arrangement of the present invention, as further described below and with respect to the accompanying drawings.

DETAILED DESCRIPTION OF THE INVENTION

The accompanying figures show various exemplary embodiments for circuit arrangements for producing short electrical pulses, according to the present invention. A logic gate 1 with a very short gate transit time is common to all of the illustrated embodiments. In all embodiments, a clock signal CLK, is supplied to a trigger input 2 of the logic gate 1, as a trigger signal, wherein an output signal generated by the trigger signal is provided at an output 3 of the logic gate 1 or at outputs 3 or 4 of the logic gate 1 and is provided as a short electrical pulse. The generated short electrical pulses can be referred to as baseband pulses.

Preferably, but not necessarily, the logic gate 1 is an ESD-protected logic gate. Advantageously, such configuration provides an inherent ESD resistance for the circuit arrangement.

Figure 1:
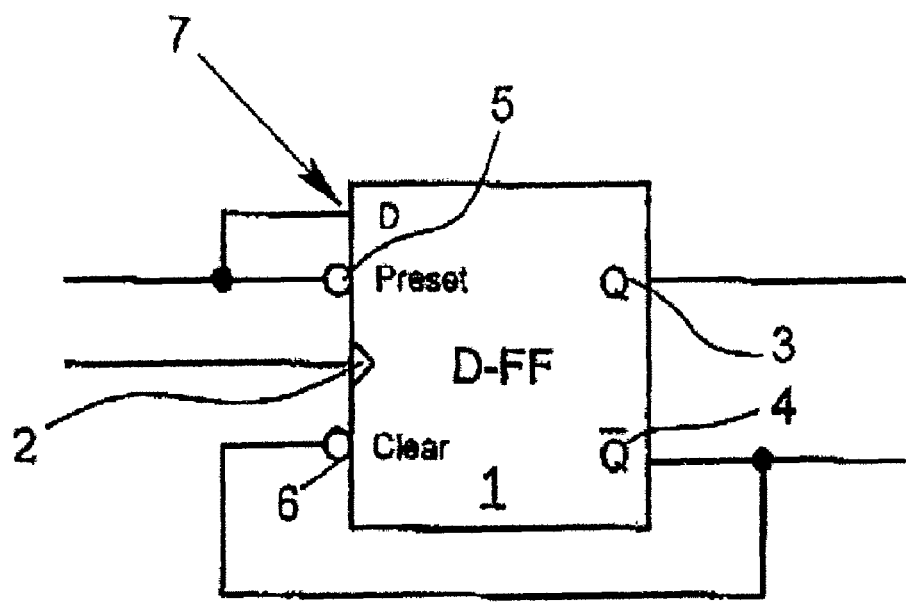
FIG. 1 shows a first embodiment of a circuit arrangement for producing short electrical pulses, according to the present invention.
Figure 2:
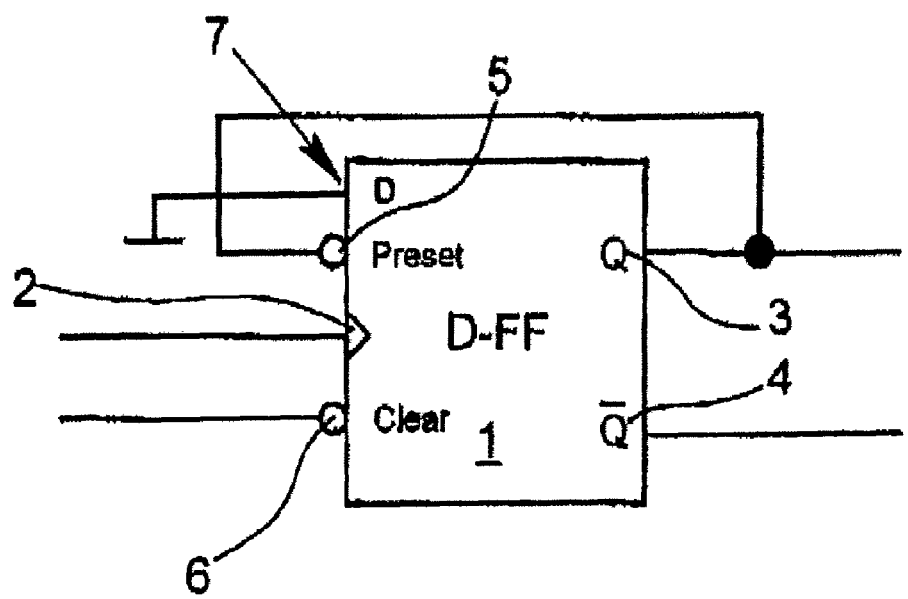
FIG. 2 shows a second embodiment of a circuit arrangement for producing short electrical pulses, according to the present invention.

In the embodiments shown in FIGS. 1 and 2, the logic gate 1 is a high-speed D-flip-flop D-FF having a clear input 5 and a preset input 6.

FIG. 1 shows the basic circuitry of a logic gate 1 provided as a high-speed D-flip-flop for generating positive and negative baseband pulses Q and $\overline{Q}$ at outputs 3 and 4 and with feedback from $\overline{Q}$ to the clear input 6. Similarly, FIG. 2 shows the basic circuitry of the logic gate 1 provided as a D-flip-flop, in turn for generating positive and negative baseband pulses Q and $\overline{Q}$ at outputs 3 and 4 and with feedback from Q to the preset input 5. With both embodiments, the outputs 3 and 4 can be used at the same time or one at a time. The output signals generated in the embodiments shown in FIGS. 1 and 2 are roughly Gaussian baseband pulses having positive polarity when output 3 is used or with negative polarity when output 4 is used. The amplitude of such baseband pulses depends on the operating voltage of the logic gate 1.

The following logic table applies to the embodiments shown in FIGS. 1 and 2.

| Inputs | | | | Outputs | | |
|---|---|---|---|---|---|---|
| $\overline{CLR}$ | $\overline{PR}$ | D | CLK | Q | $\overline{Q}$ | Function |
| L | H | X | X | L | H | Clear |
| H | L | X | X | H | L | Preset |
| L | L | X | X | H | H | — |
| H | H | L | Y | L | H | — |
| H | H | H | Y | H | L | — |

Where: L = low signal
H = high signal
X = any value
Y = any value

In the above logic table, $\overline{CLR}$ stands for the inverted clear signal, $\overline{PR}$ for the inverted preset signal, D for the data input signal 7, and CLK for the clock signal.

In the embodiments of the circuit arrangements of FIGS. 1 and 2, the logic gate 1 is a clocked D-flip-flop (e.g., clocked flip-flops, RS flip-flops, D-flip-flops, state-clocked and flank-clocked are compared and further described in Erwin Boehmer, "ELEMENTS OF APPLIED ELECTRONICS," Compendium for Training and Job, Viewegs Fachbuecher der Technik, 7th revised edition, Verlag Friedr. Vieweg & Sohn, Braunschweig/Wiesbaden, pages 222 and 223).

Figure 3:
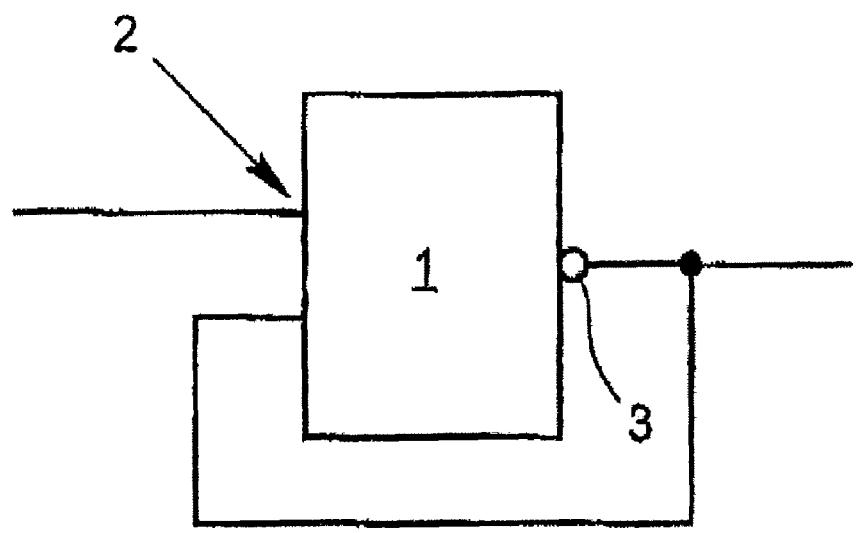
FIG. 3 shows a third embodiment of a circuit arrangement for producing short electrical pulses, according to the present invention.
Figure 4:
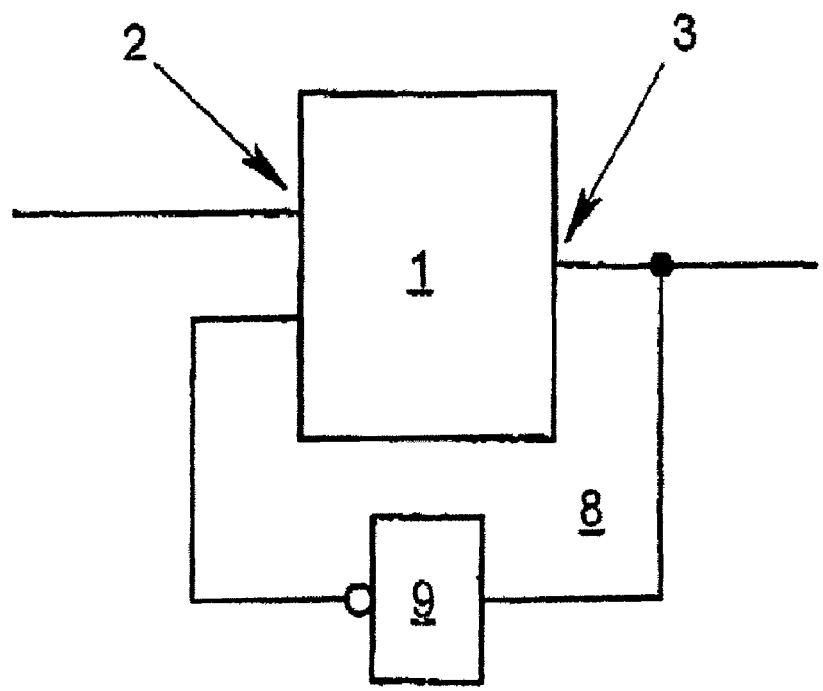
FIG. 4 shows a fourth embodiment of a circuit arrangement for producing short electrical pulses, according to the present invention.

FIGS. 3 and 4 show embodiments of the circuit arrangements in which the logic gates 1 can be individual gates, such as AND gates, OR gates, NAND gates, EXOR gates, INVERTER gates, and the like.

In further embodiments, any suitable pulse shaper network (not shown), for example, for shortening the pulse duration of the generated short electrical pulses can be connected downstream of the output 3 or 4 of the logic gate 1. In addition, in the feedback path 8 of the logic gate 1 there can be provided any suitable electrical component (not shown) with a lowpass behavior, wherein with such component the pulse duration of the generated electrical pulses can be increased.

In the embodiment illustrated in FIG. 4, it is shown that in the feedback path 8 of the logic gate 1 there is another logic gate 9 provided, such as an INVERTER gate, and the like.

While the present inventions have been described in connection with a number of exemplary embodiments, and implementations, the present inventions are not so limited, but rather cover various modifications, and equivalent arrangements, which fall within the purview of the appended claims of the present invention.

What is claimed is:

1. A circuit arrangement for producing short electrical pulses, the circuit arrangement comprising:
a logic gate having a very short gate transit time and having a clock signal supplied to a trigger input of the logic gate as a trigger signal,
wherein an output signal based only on the trigger signal is generated as a short electrical pulse at (i) a single output of the logic gate, (ii) at one or more of plural outputs of the logic gate, or (iii) at both of plural outputs of the logic gate,
wherein the logic gate is a high speed D-flip-flop (D-FF) with one clear input and one preset input and
further comprising an electrical component with lowpass behavior in a feedback path of the logic gate by which the pulse duration of the generated electrical pulses is lengthened.

2. The circuit arrangement of claim 1, wherein the logic gate is an electrostatic discharge (ESD)-protected logic gate.

3. The circuit arrangement of claim 1, further comprising a logic gate and an inverter gate in a feedback path of the logic gate.

4. A circuit arrangement for producing short electrical pulses, the circuit arrangement comprising;
a logic gate having a very short gate transit time and having a clock signal supplied to a trigger input of the logic gate as a trigger signal,
wherein an output signal based only on the trigger signal is generated as a short electrical pulse at at least one of (i) a single output of the logic gate, (ii) at at least one of plural outputs of the logic gate, or (iii) at both of a pair of outputs of the logic gate,
wherein the logic gate is one of an AND gate, an OR gate, a NAND gate, an EXOR gate, and an INVERTER gate.

5. The circuit arrangement of claim 4, wherein the logic gate is an electrostatic discharge (ESD) protected logic gate.

6. The circuit arrangement of claim 4, further comprising an electrical component with lowpass behavior in a feedback path of the logic gate.

7. The circuit arrangement of claim 4, further comprising a logic gate, and an Inverter gate in a feedback path of the logic gate.

* * * * *